United States Patent
Zheng et al.

(10) Patent No.: US 10,453,992 B2
(45) Date of Patent: Oct. 22, 2019

(54) LIGHT EMITTING DIODE

(71) Applicant: XIAMEN SANAN OPTOELECTRONICS TECHNOLOGY CO., LTD., Xiamen (CN)

(72) Inventors: Yuan-yu Zheng, Xiamen (CN); Jiansen Zheng, Xiamen (CN); Mingyue Wu, Xiamen (CN); Chilun Chou, Xiamen (CN); Cai-hua Qiu, Xiamen (CN); Xiao Luo, Xiamen (CN); Feng Lin, Xiamen (CN); Shuiqing Li, Xiamen (CN); Chaoyu Wu, Xiamen (CN); Kunhuang Cai, Xiamen (CN)

(73) Assignee: XIAMEN SANAN OPTOELECTRON CO., LTD., Xiamen (CN)

( * ) Notice: Subject to any disclaimer, the term of this patent is extended or adjusted under 35 U.S.C. 154(b) by 11 days.

(21) Appl. No.: 15/859,555

(22) Filed: Dec. 31, 2017

(65) Prior Publication Data
US 2018/0145210 A1    May 24, 2018

Related U.S. Application Data

(63) Continuation of application No. PCT/CN2016/011672, filed on Dec. 23, 2016.

(30) Foreign Application Priority Data

Apr. 29, 2016 (CN) .......................... 2016 1 0276669

(51) Int. Cl.
*H01L 33/06* (2010.01)
*H01L 33/10* (2010.01)
(Continued)

(52) U.S. Cl.
CPC .......... *H01L 33/06* (2013.01); *H01L 33/0066* (2013.01); *H01L 33/10* (2013.01);
(Continued)

(58) Field of Classification Search
USPC ............................................ 257/94
See application file for complete search history.

(56) References Cited

U.S. PATENT DOCUMENTS 5,237,581 A * 8/1993 Asada .................... H01L 33/105
257/98
6,229,834 B1 * 5/2001 Nisitani .................. H01L 33/30
257/94
(Continued)

*Primary Examiner* — Nilufa Rahim
(74) *Attorney, Agent, or Firm* — SYNCODA LLC; Feng Ma

(57) ABSTRACT

An AlGaInP light-emitting diode includes from bottom up a substrate, a distributed Bragg reflector (DBR) reflecting layer, an N-type semiconductor layer, a quantum well light-emitting layer, a P-type semiconductor layer, a transient layer and a P-type current spreading layer. The DBR reflecting layer is multispectral-doping. The P-type semiconductor layer includes a first P-type semiconductor layer adjacent to the quantum well light-emitting layer and a second P-type semiconductor layer adjacent to the transient layer. A doping concentration of the second P-type semiconductor layer is lower than that of the first P-type semiconductor layer. By improving doping concentration of the multispectral DBR reflecting layer, current spreading can be improved, thus improving aging performance. A concentration difference is formed with the transient layer to balance doping of the transient layer; this avoids increasing non-radiation composition from high doping of the transient layer during long-time aging.

20 Claims, 3 Drawing Sheets

(51) Int. Cl.
  *H01L 33/00* (2010.01)
  *H01L 33/14* (2010.01)
  *H01L 33/30* (2010.01)
  *H01L 33/04* (2010.01)

(52) U.S. Cl.
  CPC .............. *H01L 33/04* (2013.01); *H01L 33/14* (2013.01); *H01L 33/305* (2013.01)

(56) References Cited

U.S. PATENT DOCUMENTS

| | | | |
|---|---|---|---|
| 6,346,719 B1* | 2/2002 | Udagawa | H01L 33/30 257/101 |
| 7,622,745 B2* | 11/2009 | Suzuki | B82Y 20/00 257/102 |
| 7,759,148 B2* | 7/2010 | Hanamaki | H01S 5/0421 257/102 |
| 2002/0036296 A1* | 3/2002 | Akaike | H01L 33/305 257/102 |
| 2002/0104997 A1* | 8/2002 | Kuo | H01L 33/0062 257/79 |
| 2009/0140273 A1* | 6/2009 | Takeuchi | B82Y 20/00 257/94 |
| 2012/0319080 A1* | 12/2012 | Fudeta | H01L 33/12 257/13 |
| 2014/0291612 A1* | 10/2014 | Aihara | H01L 33/385 257/13 |

* cited by examiner

LIGHT EMITTING DIODE

CROSS-REFERENCE TO RELATED APPLICATIONS

The present application is a continuation of, and claims priority to, PCT/CN2016/111672 filed on Dec. 23, 2016, which claims priority to Chinese Patent Application No. 201610276669.2 filed on Apr. 29, 2016. The disclosures of these applications are hereby incorporated by reference in their entirety.

BACKGROUND

In recent years, various methods have been studied to improve luminance of AlGaInP-series light-emitting diodes (LEDs). With great breakthroughs in this area, the application of AlGaInP-series light-emitting diodes extends widely to display system, lighting system, automatic system, etc. For example, according to Chinese patent 201210341574.6, at least two Bragg reflector layers with different corresponding reflecting wavelength are provided to expand bandwidth of the reflection wavelength of LED and to improve internal quantum efficiency.

SUMMARY

The inventors of the present disclosure have recognized that, to respond to fierce market competition, chip size is increasingly narrowed to cut cost, coming up with new performance problems. When the chip size is narrowed, for example, at 7.0 mil×7.0 mil, in conventional LED structures, the resistance to aging caused by high current is dramatically reduced, which cannot meet market requirements. Therefore, it is necessary to study and improve anti-aging performance of small-size chips driven by high current.

Various embodiments of the present disclosure provide an AlGaInP light-emitting diode to improve the resistance to aging caused by high current.

The technical scheme of the present disclosure is: an AlGaInP light-emitting diode with improving resistance to aging caused by high current includes from bottom to up a substrate, a distributed Bragg reflector (DBR) reflecting layer, an N-type semiconductor layer, a quantum well light-emitting layer, a P-type semiconductor layer, a transient layer and a P-type current spreading layer. The DBR reflecting layer is multispectral-doping. The P-type semiconductor layer includes a first P-type semiconductor layer adjacent to the quantum well light-emitting layer and a second P-type semiconductor layer adjacent to the transient layer; wherein, doping concentration of the second P-type semiconductor layer is lower than that of the first P-type semiconductor layer. By using a segmented-doping multispectral DBR reflecting layer, DBR doping concentration is improved; and by lowering concentration of the P-type semiconductor doping layer at the adjacent segmentation of the transient layer, a segmented P-type semiconductor layer with certain thickness ratio and concentration ratio is formed.

According to studies, in small-sized chip, degrading current spreading of the DBR layer is a key point to affect aging. Through segmented-doping multispectral DBR, DBR spreading effect can be improved under same current density. Meanwhile, without influencing voltage process window, improvement of the DBR doping concentration facilitates current spreading and dramatically improves anti-aging performance. In addition, doping concentration of the transient layer is the key affecting aging. In conventional method, aging is improved by lowering doping concentration of the transient layer. However, decreased doping concentration may cause increase of voltage VFavg of LED. In the present disclosure, by lowering doping concentration of the P-type semiconductor doping layer at the segmentation adjacent to the transient layer, a concentration difference is formed with that of the transient layer to balance doping of the transient layer; this avoids increasing non-radiation composition from high doping of the transient layer during long-time aging, which may cause light attenuation; in addition, voltage is controlled by keeping doping concentration of the P-type semiconductor layer at the segmentation adjacent to the quantum well, thus dramatically improving reliability.

In some embodiments, the substrate can be GaAs, GaP or Ge substrate that is suitable for epitaxial growth.

In some embodiments, the DBR reflecting layer adopts multi-spectral DBR, with preferred material of $Al_xGa_{1-x}As/Al_yGa_{1-y}As$, where, $0<x\leq1$, $0<y<1$.

In some embodiments, in the multispectral DBR, the reflection wave band is divided into three bands; wherein, reflection wave bands of the first DBR reflecting layer, the second DBR reflecting layer and the third DBR reflecting layer are 700-750 nm, 650-700 nm, and 600-650 nm respectively.

In some embodiments, for the multispectral DBR, there are 2-7 pairs of the first DBR reflecting layers, 6-12 pairs of the second DBR reflecting layers, and 13-20 pairs of the third DBR reflecting layers.

In some embodiments, doping impurity of the multispectral DBR is any of Si, Sn, S, Se or Te.

In some embodiments, in the multispectral DBR, doping concentration of the first DBR reflecting layer is $7\times10^{18}$-$1\times10^{20}$ cm$^{-3}$; doping concentration of the second DBR reflecting layer is $5\times10^{18}$-$1\times10^{20}$ cm$^{-3}$, which is lower than that of the first DBR reflecting layer; and doping concentration of the third DBR reflecting layer is $2\times10^{18}$-$1\times10^{20}$ cm$^{-3}$, which is lower than that of the second DBR reflecting layer.

In some embodiments, the N-type semiconductor layer is GaAs, $Al_xGa_yIn_{1-x}P$ and $Al_xIn_{(1-x)}P$, and preferably $Al_xIn_{(1-x)}P$, where, $0<x<1$.

In some embodiments, doping impurity of the N-type doping is any of Si, Sn, S, Se or Te.

In some embodiments, N-type doping concentration is $0.5\times10^{18}$-$3.0\times10^{18}$ cm$^{-3}$.

In some embodiments, material of the quantum well light-emitting layer is $Al_xGa_yIn_{1-x-y}P$, where, $0<x<1$, $0<y<1$.

In some embodiments, material of P-type semiconductor is the same as that of the N-type semiconductor, preferably $Al_xIn_{(1-x)}P$, wherein $0<x<1$.

In some embodiments, doping impurity of the P-type doping is any of Be, Mg, Zn, Cd or C.

In some embodiments, the segmented P-type semiconductor layer includes a first P-type semiconductor layer at the segmentation adjacent to the quantum well and a second P-type semiconductor layer at the segmentation adjacent to the transient layer.

In some embodiments, doping concentration of the first P-type semiconductor layer at the segmentation adjacent to the quantum well is $0.7\times10^{18}$-$1.5\times10^{18}$ cm$^{-3}$.

In some embodiments, thickness of the first P-type semiconductor layer at the segmentation adjacent to the quantum well is 0.3-1.0 μm.

In some embodiments, doping concentration of the second P-type semiconductor layer at the adjacent segmentation of the transient layer is $0.28\times10^{18}$-$1.2\times10^{18}$ cm$^{-3}$.

In some embodiments, thickness of the second P-type semiconductor layer at the segmentation adjacent to the transient layer is 0.03-0.3 µm.

In some embodiments, thickness of the second P-type semiconductor layer is 10%-30% that of the first P-type semiconductor layer.

In some embodiments, doping concentration of the second P-type semiconductor layer is 40%-80% that of the first P-type semiconductor layer.

In some embodiments, the transient layer adopts $Al_xGa_yIn_{1-x-y}P$ material for gradient growth of each component, where, 0<x<1, 0<y<1, x+y<1.

In some embodiments, doping concentration of the transient layer is $1.5\times10^{18}$-$4.0\times10^{18}$ cm$^{-3}$.

In some embodiments, the P-type current spreading layer is GaP with Mg doping.

In some embodiments, thickness of the P-type current spreading layer is 2-10 µm.

Compared with existing technologies, some embodiments of the present disclosure can have one or more of the following technical effects. In the LED structure, the segmented-doping multispectral DBR can effectively improve current spreading and anti-aging performance; improved doping concentration of the DBR can further improve anti-aging performance without influencing the voltage process window. In addition, by lowering doping concentration of the P-type semiconductor doping layer at the segmentation adjacent to the transient layer, a concentration difference is formed with that of the transient layer to balance doping of the transient layer; this avoids increasing non-radiation composition from high doping of the transient layer during long-time aging, which may cause light attenuation; in addition, voltage is controlled by keeping doping concentration of the P-type semiconductor layer at the segmentation adjacent to the quantum well, thus dramatically improving reliability. This disclosure, in particular, improves anti-aging performance dramatically when the light-emitting diode is smaller than 50 mil$^2$ and drive current is higher than or equal to 100 mA.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
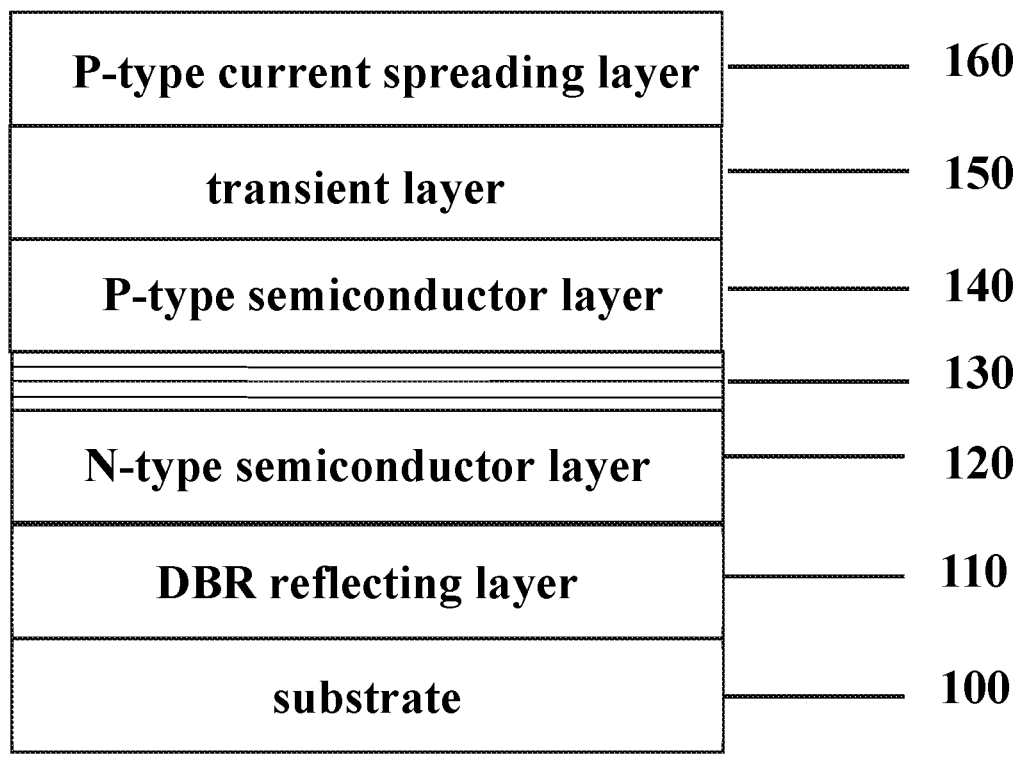
FIG. 1 shows a schematic diagram of a conventional AlGaInP light-emitting diode.

In the drawings: 100: substrate, 110: DBR reflecting layer, 120: N-type semiconductor layer, 130: quantum well light-emitting layer, 140: P-type semiconductor layer, 150: transient layer, 160: P-type current spreading layer; 200: substrate, 210: DBR reflecting layer, 211: first DBR reflecting layer, 212: second DBR reflecting layer, 213: third DBR reflecting layer, 220: N-type semiconductor layer, 230: quantum well light-emitting layer, 240: P-type semiconductor layer, 241: first P-type semiconductor layer, 242: second P-type semiconductor layer, 250: transient layer, 260: P-type current spreading layer, 270: P electrode, 280: N electrode.

DETAILED DESCRIPTION

Various embodiments of the present disclosure will be explained in details with reference to the accompanying drawings. Before further description, it should be understood, however, that various modifications and changes may be made to these embodiments. Therefore, the present disclosure is not limited to the embodiments below. It should also be noted that the scope of the present disclosure should still be subjected to the scope defined in the claims and the embodiments are merely for purposes of illustration, rather than restricting. Unless otherwise specified, all technical and scientific words shall have the same meanings as understood by persons skilled in the art.

Embodiment 1

Figure 2:
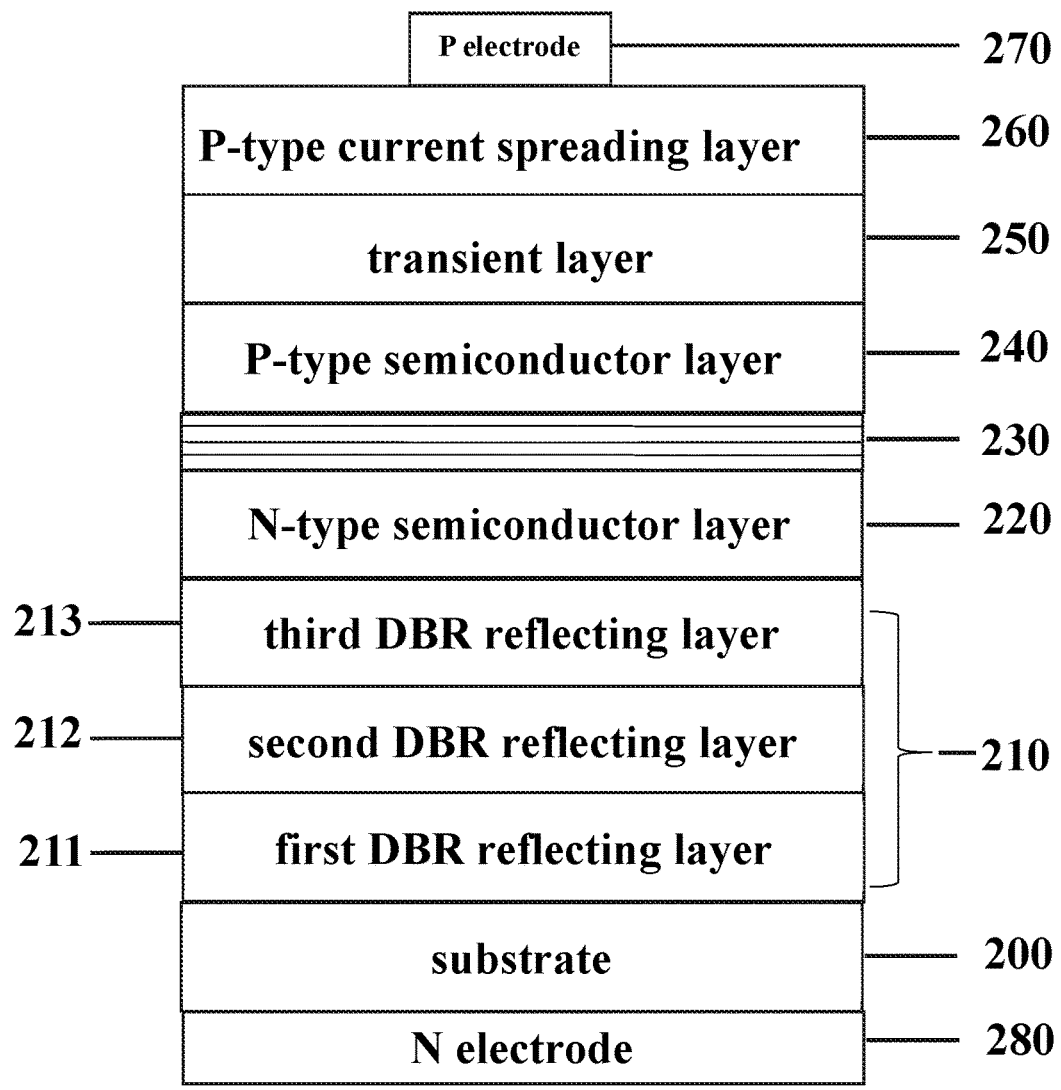
FIG. 2 shows a schematic diagram of an AlGaInP light-emitting diode according to Embodiments 1 and 2 of the present disclosure.

As shown in FIG. 2, this embodiment provides an AlGaInP light-emitting diode, includes process steps below: Grow a first DBR reflecting layer 211, a second DBR reflecting layer 212, a third DBR reflecting layer 213, an N-type semiconductor layer 220, a quantum well light-emitting layer 230, a P-type semiconductor layer 240, a transient layer 250 and a P-type current spreading layer 260 over the substrate 200 in successive via metal-organic chemical vapor deposition (MOCVD).

In the fabrication process of the AlGaInP light-emitting diode according to the present disclosure, the carrier gas is high-purity $H_2$, and Ga, Al, In, As, P sources are TMGa, TMAl, TMIn, $AsH_3$ and $PH_3$, respectively. N-type and P-type doping agents are $Si_2H_6$ and $Cp_2Mg$, respectively. Details are as follows:

First, providing a GaAs substrate.

Second, deoxidizing the surface of the GaAs substrate under temperature of 650-750° C., preferably 700° C. and then inputing $AsH_3$.

Third, growing a multispectral DBR reflecting layer over the substrate, with material of $Al_xGa_{1-x}As/Al_yGa_{1-y}As$, where, 0<x≤1, 0<y<1, x=0, y=0.5, which includes:

growing a first DBR reflecting layer 211, with reflecting wavelength of 720 nm and doping concentration of $2.0\times10^{19}$ cm$^{-3}$, wherein, preferred number of pairs is 6; next, growing a second DBR reflecting layer 212 with reflecting wavelength of 670 nm and doping concentration of $1.0\times10^{19}$ cm$^{-3}$, wherein, preferred number of pairs is 10; at last, growing a third DBR reflecting layer 213 with reflecting wavelength of 630 nm and doping concentration of $6.0\times10^{18}$ cm$^{-3}$, wherein, preferred number of pairs is 14.

Forth, growing an N-type semiconductor layer 220 over the third DBR reflecting layer 213, with preferred material of $Al_xIn_{(1-x)}P$, where, 0<x<1 and the doping material is Si.

Fifth, growing a quantum well light-emitting layer 230 over the N-type semiconductor layer 220, wherein, the light-emitting layer material is $Al_xGa_yIn_{1-x-y}P$, where, 0<x<1, 0<y<1.

Sixed, growing a P-type semiconductor layer 240 over the quantum well light-emitting layer 230 with doping concentration of $1.0\times10^{18}$ cm$^{-3}$ and preferred thickness of 0.65 µm.

Seventh, growing a transient layer 250 over the P-type semiconductor layer 240, wherein, the transient layer is $Al_xGa_yIn_{1-x-y}P$, where 0<x<1, 0<y<1, x+y<1. Each component is under gradient growth.

Eighth, growing a P-type current spreading layer 260 over the transient layer 250 with thickness between 2-10 μm, and preferably 5 μm, wherein, the material is GaP.

In this new-type AlGaInP structure LED, after fabrication of the P-type electrode 270 and the N-type electrode 280, a small-size chip of 5.8 mil×5.8 mil is used for evaluation. Under 100 mA and 50° C., long-term aging light attenuation value can be controlled within −8%. The performance is improved compared with that of the conventional structure (above −20%).

Embodiment 2

As shown in FIG. 2, differences between Embodiment 2 and Embodiment 1 may include: with improvement of doping concentration of the multi-spectral DBR, doping concentrations of three segmentations of DBR are improved by 20% respectively, i.e., doping concentrations of the first DBR reflecting layer 211, the second DBR reflecting layer 212 and the third DBR reflecting layer 213 are $2.4\times10^{19}$ cm$^{-3}$, $1.2\times10^{19}$ cm$^{-3}$ and $7.2\times10^{18}$ cm$^{-3}$ respectively. Other structures remain the same.

In this new-type AlGaInP structure LED, after fabrication of the P-type electrode 270 and the N-type electrode 280, a small-size chip of 5.8 mil×5.8 mil is used for evaluation. Under 100 mA and 50° C., long-term aging light attenuation value can be controlled within −5%. It can be seen that with improvement of DBR doping concentration, resistance to high current of small-size chip can be dramatically improved. However, this is not to say that the higher is the DBR doping, the better. Higher doping may produce impurities, thus increasing series resistance and voltage VFavg. Therefore, DBR doping concentration is controlled within $1\times10^{20}$ cm$^{-3}$.

Embodiment 3

Figure 3:
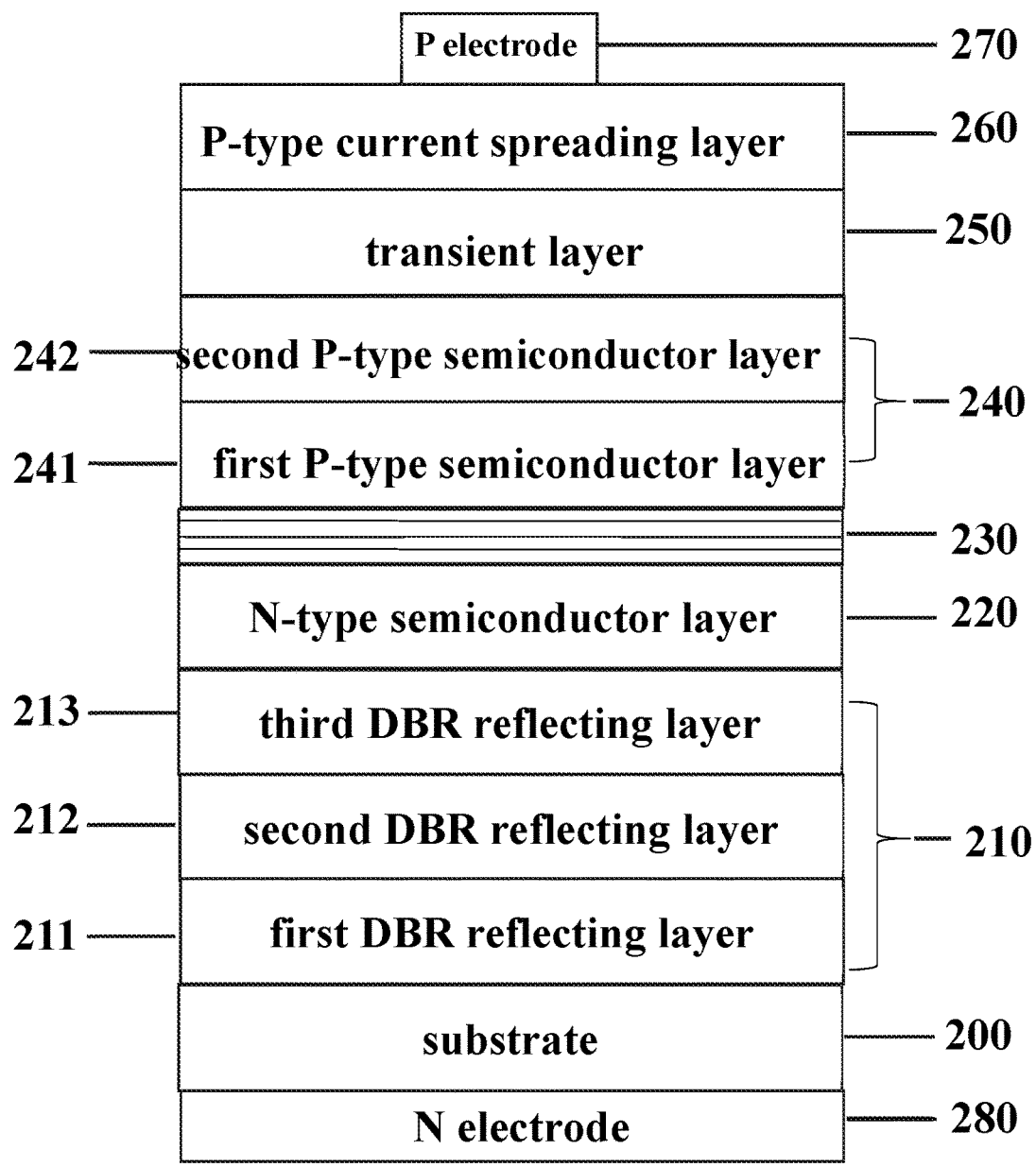
FIG. 3 shows a schematic diagram of an AlGaInP light-emitting diode according to Embodiments 3 and 4 of the present disclosure.

Differences between Embodiment 3 and Embodiment 2 may include: on the basis of Embodiment 2, doping concentration of the second P-type semiconductor layer adjacent to the transient layer is lowered to fabricate a segmented doping P-type semiconductor layer. As shown in FIG. 3, grow a P-type semiconductor layer over the quantum well light-emitting layer 230, preferably made of $Al_xIn_{(1-x)}P$. Set growth temperature to 670° C. and reaction chamber pressure to 60 Torr. Doping material is Mg. During growth of the first P-type semiconductor layer 241 adjacent to the quantum well light-emitting layer, input Cp$_2$Mg, and continue inputting for 10 min when flow setting remains unchanged. The doping concentration is $1.0\times10^{18}$ cm$^{-3}$ and growth thickness is about 0.5 μm. Next, during growth of the second P-type semiconductor layer 242 adjacent to the transient layer, Mg flow is decreased 20% with 1 min gradient method; then, keep stable growth for 3 min; maintain doping concentration at $0.8\times10^{18}$ cm$^{-3}$. The thickness is about 0.15 μm, which is 30% of thickness of the first P-type semiconductor layer. A segmented doping P-type semiconductor layer structure is therefore fabricated.

In this new-type AlGaInP structure LED, after fabrication of the P-type electrode 270 and the N-type electrode 280, a small-size chip of 5.8 mil×5.8 mil is used for evaluation. Under 100 mA and 50° C., long-term aging light attenuation value can be controlled within −3%. This indicates that the resistance to aging caused by high current can be effectively improved by lowering doping concentration of the P-type semiconductor layer adjacent to the transient layer.

Embodiment 4

Differences between Embodiment 4 and Embodiment 3 may include: extend growth time of the first P-type semiconductor layer adjacent to the quantum well, and shorten growth time of the second P-type semiconductor layer adjacent to the transient layer to optimize thickness ratio. Reduce the doping flow set value of the second P-type semiconductor layer to about $0.5\times10^{18}$ cm$^{-3}$, which is 50% of that of the first P-type semiconductor layer to optimize doping ratio.

The P-type semiconductor is over the quantum well light-emitting layer.

Set growth temperature to 670° C., and reaction chamber pressure to 60 Torr. The doping material is Mg. During growth of the first P-type semiconductor layer, input Cp$_2$Mg, and continue inputting for 12 min when flow setting remains unchanged. The doping concentration is $1.0\times10^{18}$ cm$^{-3}$ and growth thickness is about 0.6 μm. During growth of the second P-type semiconductor layer, reduce Mg flow to 50% with 1 min gradient method, and keep stable growth for 1.8 min. Maintain doping concentration at $0.5\times10^{18}$ cm$^{-3}$. The thickness is about 0.09 μm, which is 15% of that of the first P-type semiconductor layer. A segmented P-type semiconductor structure with preferred performance is therefore fabricated.

On the basis of Embodiment 3, Embodiment 4 further improves the segmented P-type doping layer structure with further optimized doping concentration ratio and thickness ratio. In Embodiment 4, doping of the second P-type semiconductor layer adjacent to the transient layer is further lowered to optimize anti-aging performance. Moreover, voltage VFavg is kept stable by increasing thickness of the first P-type semiconductor layer and reducing thickness of the second P-type semiconductor layer. Through this optimization scheme of thickness ratio and doping ratio, the resistance to aging caused by high current can be further improved to improve LED reliability.

In this new-type AlGaInP structure LED, after fabrication of the P-type electrode 270 and the N-type electrode 280, a small-size chip of 5.8 mil×5.8 mil is used for evaluation. Under 100 mA and 50° C., long-term aging light attenuation value can be controlled within −1.5% under 100 mA and 50° C.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. An AlGaInP light-emitting diode, comprising from bottom up:
   a substrate;
   a distributed Bragg reflector (DBR) reflecting layer;
   an N-type semiconductor layer;
   a quantum well light-emitting layer;
   a P-type semiconductor layer;
   a transient layer; and
   a P-type current spreading layer;

wherein:
the DBR reflecting layer is multispectral-doping, comprising:
a first DBR reflecting layer;
a second DBR reflecting layer; and
a third DBR reflecting layer;
a doping concentration of the first DBR reflecting layer is higher than a doping concentration of the second DBR reflecting layer, and the doping concentration of the second DBR reflecting layer is higher than a doping concentration of the third DBR reflecting layer;
the P-type semiconductor layer comprises:
a first P-type semiconductor layer adjacent to the quantum well light-emitting layer; and
a second P-type semiconductor layer adjacent to the transient layer; wherein a doping concentration of the second P-type semiconductor layer is lower than a doping concentration of the first P-type semiconductor layer;
wherein a material of the P-type semiconductor layer comprises $Al_xIn_{(1-x)}P$, wherein $0<x<1$.

2. The AlGaInP light-emitting diode of claim 1, configured to be smaller than 50 mil$^2$, and with a drive current higher than or equal to 100 mA to improve aging performance.

3. The AlGaInP light-emitting diode of claim 1, wherein the substrate is selected from at least one of GaAs, GaP or Ge suitable for epitaxial growth.

4. The AlGaInP light-emitting diode of claim 1, wherein the doping concentration of the third DBR reflecting layer is $2\times10^{18}\sim1\times10^{20}$ cm$^{-3}$.

5. The AlGaInP light-emitting diode of claim 1, wherein reflection wave bands of the first DBR reflecting layer, the second DBR reflecting layer and the third DBR reflecting layer are 700-750 nm, 650-700 nm, and 600-650 nm, respectively.

6. The AlGaInP light-emitting diode of claim 1, wherein there are 2-7 pairs of the first DBR reflecting layer, 6-12 pairs of the second DBR reflecting layer, and 13-20 pairs of the third DBR reflecting layer, respectively.

7. The AlGaInP light-emitting diode of claim 1, wherein the doping concentration of the second P-type semiconductor layer is 40%-80% the doping concentration of the first P-type semiconductor layer.

8. The AlGaInP light-emitting diode of claim 1, wherein the doping concentration of the first P-type semiconductor layer is $0.7\times10^{18}$-$1.5\times10^{18}$ cm$^{-3}$, and the doping concentration of the second P-type semiconductor layer is $0.28\times10^{18}$-$1.2\times10^{18}$ cm$^{-3}$.

9. The AlGaInP light-emitting diode of claim 1, wherein a thickness of the second P-type semiconductor layer is 10%-30% of a thickness of the first P-type semiconductor layer.

10. The AlGaInP light-emitting diode of claim 1, wherein a thickness of the first P-type semiconductor layer is 0.3-1.0 µm, and a thickness of the second P-type semiconductor layer is 0.03-0.3 µm.

11. The AlGaInP light-emitting diode of claim 1, wherein a doping concentration of the transient layer is $1.5\times10^{18}$-$4.0\times10^{18}$ cm$^{-3}$.

12. The AlGaInP light-emitting diode of claim 1, wherein the transient layer adopts $Al_xGa_yIn_{1-x-y}P$ material for gradient growth of each component, wherein, $0<x<1$, $0<y<1$, $x+y<1$.

13. The AlGaInP light-emitting diode of claim 1, wherein the DBR reflecting layer adopts multi-spectral DBR, comprising a material of $Al_xGa_{1-x}As/Al_yGa_{1-y}As$, where, $0<x\le1$, $0<y<1$.

14. The AlGaInP light-emitting diode of claim 1, wherein a doping impurity of the multispectral DBR reflecting layer is any of Si, Sn, S, Se or Te.

15. The AlGaInP light-emitting diode of claim 1, wherein the doping concentration of the first DBR reflecting layer is $7\times10^{18}$-$1\times10^{20}$ cm$^{-3}$; the doping concentration of the second DBR reflecting layer is $5\times10^{18}$-$1\times10^{20}$ cm$^{-3}$, which is lower than that of the first DBR reflecting layer; and the doping concentration of the third DBR reflecting layer is $2\times10^{18}$-$1\times10^{20}$ cm$^{-3}$, which is lower than that of the second DBR reflecting layer.

16. The AlGaInP light-emitting diode of claim 1, wherein the N-type semiconductor layer comprises $Al_xIn_{(1-x)}P$, where, $0<x<1$.

17. The AlGaInP light-emitting diode of claim 1, wherein a doping impurity of the N-type semiconductor layer is any of Si, Sn, S, Se or Te.

18. The AlGaInP light-emitting diode of claim 1, wherein an N-type doping concentration of the N-type semiconductor layer is $0.5\times10^{18}$-$3.0\times10^{18}$ cm$^{-3}$.

19. The AlGaInP light-emitting diode of claim 1, wherein a material of the quantum well light-emitting layer is $Al_xGa_yIn_{1-x-y}P$, where $0<x<1$, $0<y<1$.

20. The AlGaInP light-emitting diode of claim 1, wherein:
a doping impurity of the P-type semiconductor layer comprises at least one of Be, Mg, Zn, Cd, or C.

* * * * *